United States Patent
Lee

(10) Patent No.: US 8,614,391 B2
(45) Date of Patent: Dec. 24, 2013

(54) DEVICE FOR CONVERTING ENERGY AND METHOD FOR MANUFACTURING THE DEVICE, AND ELECTRONIC APPARATUS WITH THE DEVICE

(75) Inventor: Seung Seoup Lee, Gyeonggi-do (KR)

(73) Assignee: Samsung Electro-Mechanics Co., Ltd., Suwon (KR)

( * ) Notice: Subject to any disclaimer, the term of this patent is extended or adjusted under 35 U.S.C. 154(b) by 434 days.

(21) Appl. No.: 12/874,444

(22) Filed: Sep. 2, 2010

(65) Prior Publication Data

US 2011/0290294 A1 Dec. 1, 2011

(30) Foreign Application Priority Data

May 25, 2010 (KR) .................. 10-2010-0048646

(51) Int. Cl.
*H01L 35/30* (2006.01)
*H01L 31/042* (2006.01)
*H02N 6/00* (2006.01)

(52) U.S. Cl.
USPC .......................................... 136/205; 136/248

(58) Field of Classification Search
USPC ..................... 136/200–242, 248; 257/E21.04
See application file for complete search history.

(56) References Cited

U.S. PATENT DOCUMENTS

| | | | | |
|---|---|---|---|---|
| 6,094,919 A | * | 8/2000 | Bhatia | 62/3.7 |
| 6,334,311 B1 | * | 1/2002 | Kim et al. | 62/3.2 |
| 2002/0158297 A1 | * | 10/2002 | Suwa-Shi et al. | 257/449 |
| 2006/0180191 A1 | * | 8/2006 | Yasutake | 136/211 |
| 2007/0289622 A1 | * | 12/2007 | Hecht | 136/246 |
| 2008/0230105 A1 | | 9/2008 | Kanno et al. | |
| 2010/0078795 A1 | * | 4/2010 | Dekker et al. | 257/690 |
| 2010/0116335 A1 | * | 5/2010 | Sinha | 136/258 |

FOREIGN PATENT DOCUMENTS

| | | |
|---|---|---|
| JP | 07-022655 A | 1/1995 |
| KR | 10-0868492 | 11/2008 |
| KR | 2009-0118306 A | 11/2009 |

OTHER PUBLICATIONS

Korean Office Action issued in Korean Patent Application No. 10-2010-0048646 dated Aug. 30, 2011.

* cited by examiner

*Primary Examiner* — Jonathan Johnson
*Assistant Examiner* — Tamir Ayad
(74) *Attorney, Agent, or Firm* — McDermott Will & Emery LLP

(57) ABSTRACT

The present invention provides an energy converting device, which includes: a base substrate; and a plurality of thermo-electric element structures which are sequentially stacked on the base substrate and electrically interconnected in parallel to one another.

8 Claims, 7 Drawing Sheets

[FIG. 6A]

DEVICE FOR CONVERTING ENERGY AND METHOD FOR MANUFACTURING THE DEVICE, AND ELECTRONIC APPARATUS WITH THE DEVICE

CROSS-REFERENCE TO RELATED APPLICATIONS

This application claims the benefit of Korean Patent Application No. 10-2010-0048646 filed with the Korea Intellectual Property Office on May 25, 2010, the disclosure of which is incorporated herein by reference.

BACKGROUND OF THE INVENTION

1. Field of the Invention

The present invention relates to an energy converting device, a method for manufacturing the device, and an electronic apparatus with the device; and, more particularly, to an energy converting device which includes a plurality of thermoelectric element structures for providing high energy converting efficiency, a method for manufacturing the energy converting device, and an electronic apparatus equipped with the energy converting device.

2. Description of the Related Art

Recently, various types of energy converting devices are being developed. Among these, a thermoelectric element converts heat energy into electric energy by seebeck effect resulting from electro-motive force which is generated due to a temperature difference between two materials. Since the thermoelectric element can convert thermal energy into electric energy by using a principle of a temperature difference between two materials, it may be used as an environment-friendly energy element.

However, since a conventional thermoelectric element has a remarkably low energy converting efficiency in comparison to its price, it is actually applied to electronic products at a low rate. Also, since the thermoelectric element converts thermal energy difficult to define through a direction characteristic into electric energy, the energy converting efficiency fluctuate significantly by change of an ambient temperature of the thermoelectric element.

SUMMARY OF THE INVENTION

The present invention has been proposed in order to overcome the above-described problems and it is, therefore, an object of the present invention to an energy converting device which can convert thermal energy into electric energy at high energy converting efficiency, and a method for manufacturing the same.

The present invention can provide an electronic apparatus equipped with an energy converting device that can convert thermal energy into electric energy at high energy converting efficiency.

The present invention can provide a hybrid-type electronic apparatus for improving energy converting efficiency when thermal or solar energy is converted into electric energy.

In accordance with one aspect of the present invention to achieve the object, there is provided an energy converting device including: a base substrate; and a plurality of thermoelectric element structures which are sequentially stacked on the base substrate and electrically interconnected in parallel to one another.

Each of the thermoelectric element structures includes: a P-type electrode which is disposed above an edge of one side of the base substrate in a perpendicular direction to the base substrate, an N-type electrode which is disposed above an edge of the other side of the base substrate in a perpendicular direction to the base substrate; a P-type thermoelectric pattern which extends toward the N-type electrode from the P-type electrode in a parallel relation with respect to the base substrate; an N-type thermoelectric pattern which extends toward the P-type electrode from the N-type electrode in a parallel relation with respect to the base substrate; and a conductor which is interposed between the P-type thermoelectric pattern and the N-type thermoelectric pattern.

Each of the thermoelectric element structures includes: N-type and P-type electrodes which are disposed above the base substrate to be spaced apart from each other and to be perpendicular to the base substrate, wherein the N-type and P-type electrodes have a multilayer structure where a plurality of conductive films are stacked.

Each of the thermoelectric element structures includes: N-type and P-type electrodes which are disposed above the base substrate to be spaced apart from each other and to be perpendicular to the base substrate, wherein the energy converting device further includes: an external connection unit for electrically connecting the device to an external electronic apparatus, wherein the external connection unit includes: a protective film which has grooves to expose the N-type and P-type electrodes and covers the uppermost thermoelectric element structure among the thermoelectric element structures; and electrode pads which are respectively connected to the N-type electrode and the P-type electrode and covers the grooves.

Each of the thermoelectric element structures includes: N-type and P-type thermoelectric patterns which are disposed above the base substrate at mutually different heights in a parallel relation with respect to each other, wherein the N-type and P-type thermoelectric patterns are alternately disposed one above another in such a manner that one end of the N-type thermoelectric pattern partially faces one end of the P-type thermoelectric pattern.

In accordance with other aspect of the present invention to achieve the object, there is provided an electronic apparatus including: an energy converting device including thermoelectric element structures which convert thermal energy into electric energy by seebeck effect; and at least one heating plate which is coupled to the energy converting device to thereby apply heat to the energy converting device.

The heating plate includes a circuit board.

The heating plate includes a mother board, wherein the mother board includes: a printed circuit board on which a circuit pattern is printed; and conductive vias which are formed in the printed circuit board and electrically connected to the N-type and P-type electrodes.

The thermoelectric element structures are plural in number, and are stacked in multiple layers and electrically interconnected in parallel with one another.

Each of the thermoelectric element structures includes: N-type and P-type electrodes which are disposed in a parallel direction to be spaced from each other; an N-type thermoelectric pattern which extends toward the P-type electrode from the N-type electrode; a P-type thermoelectric pattern which extends toward the N-type electrode from the P-type electrode; and a conductor interposed between the N-type and P-type thermoelectric patterns.

The N-type and P-type thermoelectric patterns are alternately disposed one above the other in such a manner that one end of the N-type thermoelectric pattern partially faces one end of the P-type thermoelectric pattern.

In accordance with other aspect of the present invention to achieve the object, there is provided an electronic apparatus including: an energy converting device having thermoelectric element structures which convert thermal energy into electric energy by seebeck effect; and a solar cell coupled to the energy converting device.

The solar cell includes: a semiconductor layer including a P-type semiconductor layer and an N-type semiconductor layer which are stacked one above the other; an upper electrode layer disposed above the semiconductor layer; an anti-reflective film disposed on the upper electrode layer; and a lower electrode layer interposed between the semiconductor layer and the energy converting device.

The solar cell includes: upper and lower transparent electrodes disposed to be spaced apart from each other; a side wall for sealing open sides of the upper and lower transparent electrodes; a transition metal oxide disposed in an inner space surrounded by the side wall, the upper and lower transparent electrodes; and a transparent substrate disposed on the upper transparent electrode.

The thermoelectric element structures are plural in number, and are stacked in multiple layers and electrically interconnected in parallel with one another.

Each of the thermoelectric element structures includes: N-type and P-type electrodes which are disposed in a parallel direction to be spaced from each other; an N-type thermoelectric pattern which extends toward the P-type electrode from the N-type electrode; a P-type thermoelectric pattern which extends toward the N-type electrode from the P-type electrode; and a conductor interposed between the N-type and P-type thermoelectric patterns.

The N-type and P-type thermoelectric patterns are alternately disposed one above the other in such a manner that one end of the N-type thermoelectric pattern partially faces one end of the P-type thermoelectric pattern.

In accordance with other aspect of the present invention to achieve the object, there is provided a method for manufacturing an energy converting device including the steps of: preparing a base substrate; and forming thermoelectric element structures which are stacked on top of each other in the same configuration with respect to each of the thermoelectric element structures and are electrically interconnected in parallel to one another.

The step of forming the thermoelectric element structures includes the steps of: forming an N-type electrode above one side edge of the base substrate; forming a P-type electrode above the other side edge of the base substrate; an N-type thermoelectric pattern which extends toward the P-type electrode from the N-type electrode in a parallel relation with respect to the base substrate; and a P-type thermoelectric pattern which extends toward the N-type electrode from the P-type electrode in a parallel relation with respect to the base substrate; a conductor which is interposed between the P-type thermoelectric pattern and the N-type thermoelectric pattern.

The step of forming the thermoelectric element structures includes the steps of: forming the thermoelectric element structures; forming the N-type electrode which is disposed above an edge of one side of the base substrate in a perpendicular direction to the base substrate; and forming the P-type electrode which is disposed above an edge of the other side of the base substrate in a perpendicular direction to the base substrate, wherein the step of forming the N-type and P-type electrodes comprises a step of stacking a plurality of conductive films on the base substrate.

The method further includes a step of forming an external connection unit which covers the uppermost thermoelectric element structure among the thermoelectric element structures, wherein the step of forming the external connection unit includes the steps of: forming a protective film with grooves which can expose the N-type and P-type electrodes, on the uppermost thermoelectric element structure among the thermoelectric element structures; and forming electrode pads which cover the grooves and are electrically connected to the N-type and P-type electrodes.

BRIEF DESCRIPTION OF THE DRAWINGS

These and/or other aspects and advantages of the present general inventive concept will become apparent and more readily appreciated from the following description of the embodiments, taken in conjunction with the accompanying drawings of which.

DETAILED DESCRIPTION OF THE PREFERABLE EMBODIMENTS

Figure 1:
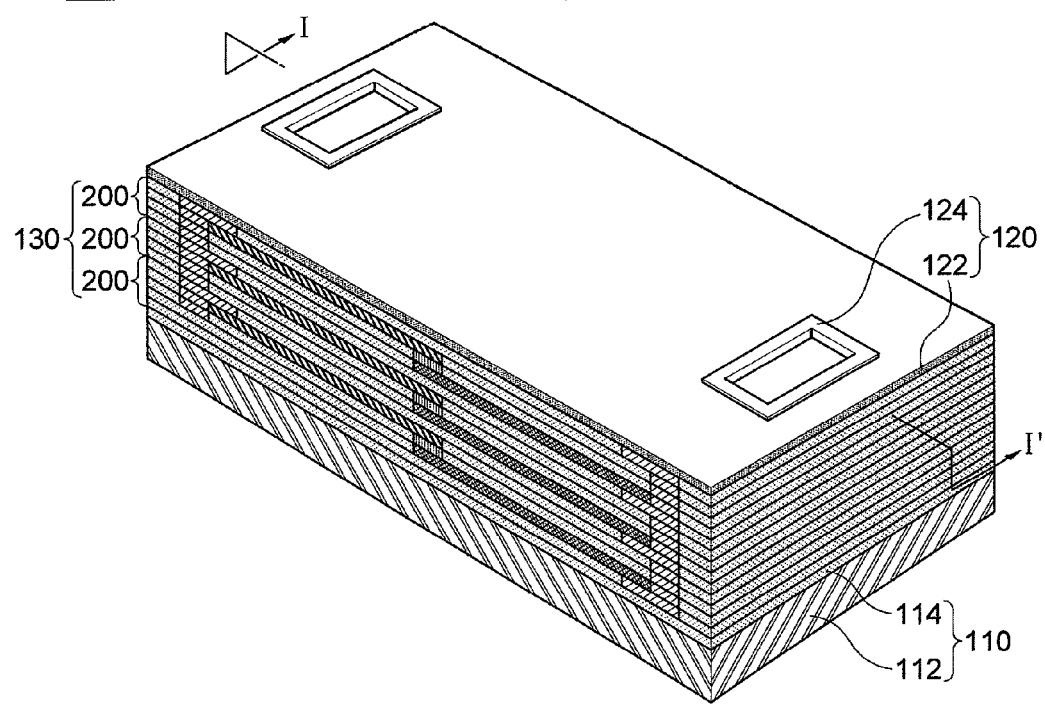
FIG. 1 is a perspective view illustrating an energy converting device in accordance with an embodiment of the present invention.

The invention now will be described more fully hereinafter with reference to the accompanying drawings, in which exemplary embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like reference numerals refer to like elements throughout.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present. Like reference numerals refer to like elements throughout. As used herein, the term "and/or" includes any and all combinations of one or more of the associated listed items.

Hereinafter, a detailed description will be given of an energy converting device and a manufacturing method thereof according to an embodiment of the present invention, with reference to the accompanying drawings.

Figure 2:
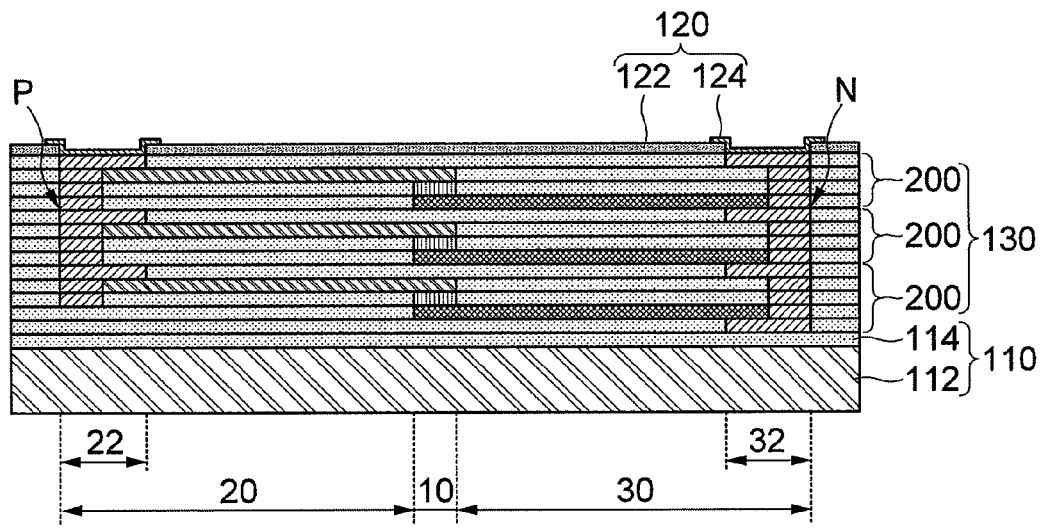
FIG. 2 is a cross-sectional view taken along the line of I-I' of FIG. 1.
Figure 3:
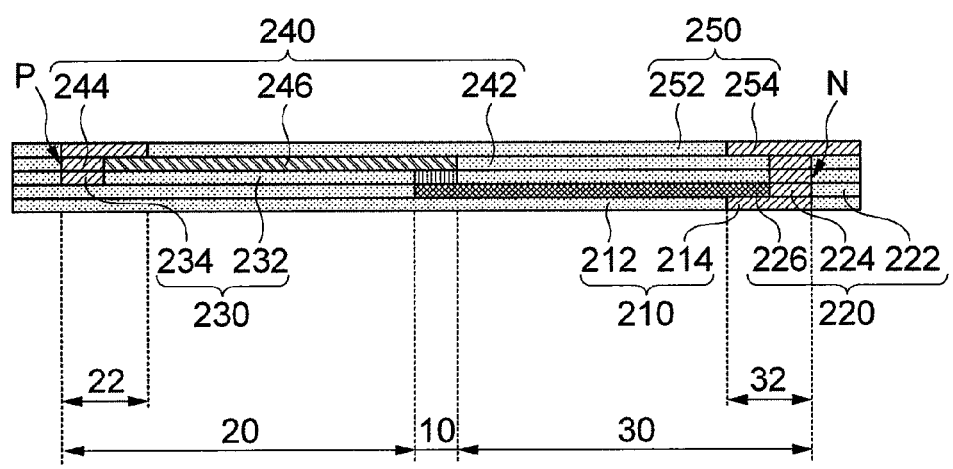
FIG. 3 is a view illustrating any one of thermoelectric element structures shown in FIGS. 1 and 2.
Figure 4:
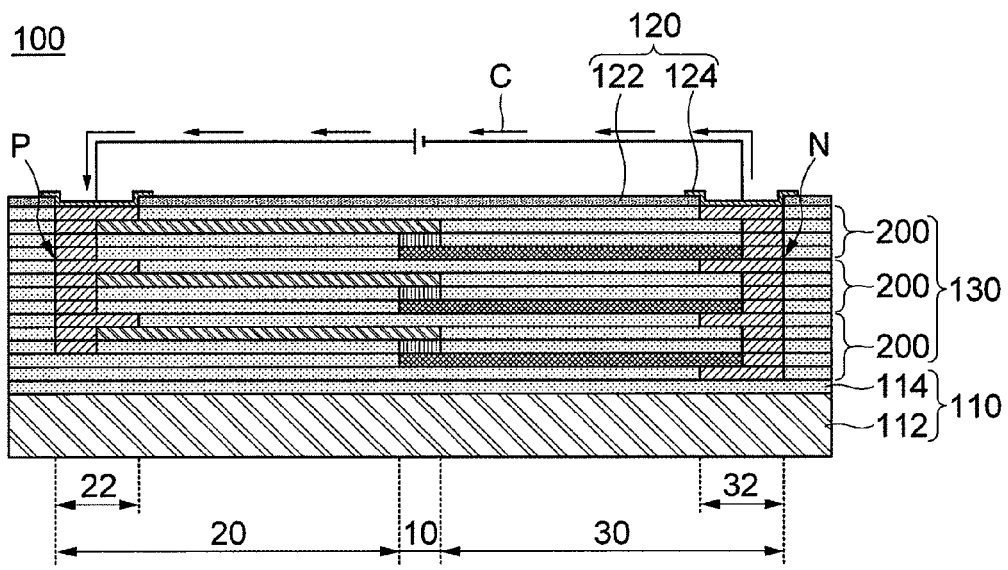
FIG. 4 is a view illustrating how to operate by the thermoelectric element structure in accordance with the embodiment of the present invention.

FIG. 1 is a perspective view illustrating an energy converting device in accordance with the embodiment of the present invention, and FIG. 2 is a cross-sectional view taken along the line of I-I' of FIG. 1. FIG. 3 is a view illustrating any one of thermoelectric element structures shown in FIGS. 1 and 2, and FIG. 4 is a view illustrating how to operate by the energy converting device in accordance with the embodiment of the present invention.

Referring to FIGS. 1 to 3, the energy converting device 100 may include a base substrate 110, an external connection unit 120 disposed on the base substrate 110, and an energy conversion unit 130 interposed between the base substrate 110 and the external connection unit 120.

The base substrate 110 may include a semiconductor substrate 112 and a buffer film 114 formed on the semiconductor substrate 112. The semiconductor substrate 112 may include any one of a silicon substrate and a glass substrate. The buffer film 114 may be an insulating film that covers the semiconductor substrate 112.

Meanwhile, the base substrate 110 may include a central region 10, and a region of one side 20 (hereinafter, referred to as "one side region") and a region of the other side 30 (hereinafter, referred to as "opposite side region"). The one side region 20 and the opposite side region 30 are respectively disposed at both sides thereof on the basis of the central region 10. The one side region 20 may include an edge region of one side 22 (hereinafter, referred to as "one side edge region") on which a P-type electrode (P) is disposed. The opposite side region 30 may include an edge region of the other side 32 (hereinafter, referred to as "opposite side edge region") on which an N-type electrode (N) is disposed.

The external connection unit 120 may be disposed on the energy conversion unit 130. The external connection unit 120 may include a protective film 122 and electrode pads 124. The protective film 122 may cover the energy conversion unit 130 to thereby protect the energy conversion unit 130 from an external environment. The protective film 122 may have grooves formed therein. Each of the grooves exposes the N-type electrode (N) and the P-type electrode (P). The electrode pads 124 may be formed to cover the N-type electrode (N) and P-type electrode (P) which are exposed by the grooves. The electrode pads 124 may correspond to a component which connects the energy conversion unit 130 to an external electronic apparatus (not shown).

The energy conversion unit 130 may include a plurality of thermoelectric element structures 200 disposed on the base substrate 110. The thermoelectric element structures 200 are constructed to be stacked one on another. Although it is assumed in the embodiments of the present invention that three thermoelectric element structures 200 are disposed, the number of the thermoelectric element structures 200 may be variously changed. Herein, each of the thermoelectric element structures 200 may have the same construction as one another. Thus, in the description of the present invention, any one of the thermoelectric element structures 200 is selected and the others are omitted.

Each of the thermoelectric element structures 200 may include first to fifth films 210 to 250 which are sequentially stacked on the base substrate 110.

The first film 210 may include a first insulating film 212 and a first conductive film 214. The first conductive film 214 may be disposed above the opposite side edge region 32 of the base substrate 110.

The second film 220 may include a second insulating film 222, a second conductive film 224, and an N-type thermoelectric pattern 226. The second insulating film 222 may be formed to cover the first insulating film 212. The second conductive film 224 may be disposed on the first conductive film 214. The N-type thermoelectric pattern 226 may be formed above the central region 10 and the other-side region 30 in such a manner to cover the first insulating film 212. Herein, an end of one side of the N-type thermoelectric pattern 226 may be extended up to the central region 10, and an end of the other side of the N-type thermoelectric pattern 226 may be extended to partially cover the first insulating film 212. The second conductive film 224 may be formed to cover a part of the second conductive film 224 which the N-type thermoelectric pattern 226 fails to cover.

The third film 230 may include the third insulating film 232 and the third conductive film 234. The third conductive films 234 may be disposed on the central region 10, the one side edge region 22, and the opposite side edge region 32 of the second film 220, respectively.

The fourth films 240 may include the fourth insulating film 242, the fourth conductive films 244, and the P-type thermoelectric pattern 246. The fourth conductive films 244 may be disposed on the one side edge region 22 and the opposite side edge region 32 of the third film 230, respectively. The P-type thermoelectric pattern 246 may have an end of one side extended to the one side edge region 22, and an end of the other side extended to the central region 10. Thus, an end of the other side of the P-type thermoelectric pattern 246 may be formed to cover the third conductive films 234.

The fifth film 250 may include the fifth insulating film 252 and the fifth conductive films 254. The fifth conductive films 254 may be disposed on the one side edge region 22 and the opposite side edge region 32 of the fourth film 240, respectively.

Herein, the first to fifth conductive films 224 to 254 stacked at the one side edge region 22 are electrically interconnected to one another to thereby implement the P-type electrode (P). Also, the first to fifth conductive films 224 to 254 stacked at the opposite side edge region 32 are electrically interconnected to one another to thereby implement the N-type electrode (N). Thus, each of the P-type electrode (P) and N-type electrode (N) may have a multilayer structure in which a plurality of conductive films are stacked on one another. The P-type electrode (P) may be disposed above the one side edge region 22 in a perpendicular direction to the base substrate 110. The N-type electrode (N) may be disposed above the opposite side edge region 32 in a perpendicular direction to the base substrate 110.

The P-type electrode (P) may be used as a negative electrode of the thermoelectric element structures 200 and the N-type electrode (N) may be used as a positive electrode of the thermoelectric element structures 200. The N-type thermoelectric pattern 226 and the P-type thermoelectric pattern 246 may be alternately disposed above the base substrate 110 in a parallel relation with respect to each other.

In addition, the N-type thermoelectric pattern 226 and the P-type thermoelectric pattern 246 may be disposed in the central region 10 in such a manner that their ends can be partially superposed one above the other in parallel with each other. Herein, the third conductive films 234 of the third film 230 disposed above the central region 10 may be used as a connection means which connects the N-type thermoelectric pattern 226 to the P-type thermoelectric pattern 246. For example, the third conductive films 234 of the third film 230 disposed above the central region 10 may be used as a conductor that electrically connects the N-type thermoelectric pattern 226 to the P-type thermoelectric pattern 246.

Meanwhile, the first to fifth conductive films 224 to 254 may be made of conductive materials. For example, the first to fifth conductive films 224 to 254 may include at least one of Al, Ni, W, Cu, Cr, Ag, and Au. The N-type thermoelectric pattern 226 and the P-type thermoelectric pattern 246 may be made of various types of materials (e.g., semiconductor material or conductive material). For example, the N-type thermoelectric pattern 226 and the P-type thermoelectric pattern 246 may be made of Si, Ge, Si/Ge, and B4C materials.

Referring to FIG. 4, when a temperature difference occurs in the energy converting device 100 with the above-described structure, currents may flow by seebeck effect. For example, when temperature difference occurs either between upper and lower regions of the energy converting device 100, or between right and left regions of the energy converting device 100, temperature difference may occur between the P-type electrode (P) and the N-type electrode (N). For example, when temperature of the P-type electrode (P) is higher than that of the N-type electrode (N), the seebeck effect allows currents to flow in order of the N-type electrode (N), the N-type thermoelectric pattern 226, the P-type thermoelectric pattern 246, and the P-type electrode (P).

As described above, the energy converting device 100 may be provided with the thermoelectric element structures 200 on the base substrate 110. The thermoelectric element structures 200 may be constructed to have multiple layers in the same manner and may be connected in parallel to one another. Thus, the energy converting device 100 may be made by increasing the number of the thermoelectric element structures 200, which results in improvement of energy converting efficiency. The energy converting efficiency is defined as a ratio where thermal energy of the energy converting device 100 is converted into electric energy. In particular, since the energy converting device 100 has a structure in which the thermoelectric element structures 200 are repeatedly stacked one on another, the energy converting device 100 can absorb thermal energy provided from an outside of the thermoelectric element structures 200 in a multiple manner. Therefore, it is possible to enhance energy converting efficiency.

Meanwhile, although it is assumed in the embodiment of the present invention that the number of the energy converting device 100 is one, a plurality of energy converting devices may be used and electrically interconnected to thereby implement an energy converting module. The energy converting module may be constructed through serial and parallel connection of energy converting devices. For example, the energy converting devices may be repeatedly disposed in a parallel direction and serially connected to one another, so that it is possible to increase power of electric energy outputted by the energy converting module.

Continuously, a detailed description will be given of a method for manufacturing a thermoelectric element in accordance with the above-described embodiment of the present invention. Herein, the repeated description of the above-described energy converting device 100 will be omitted or simplified.

Figure 5:
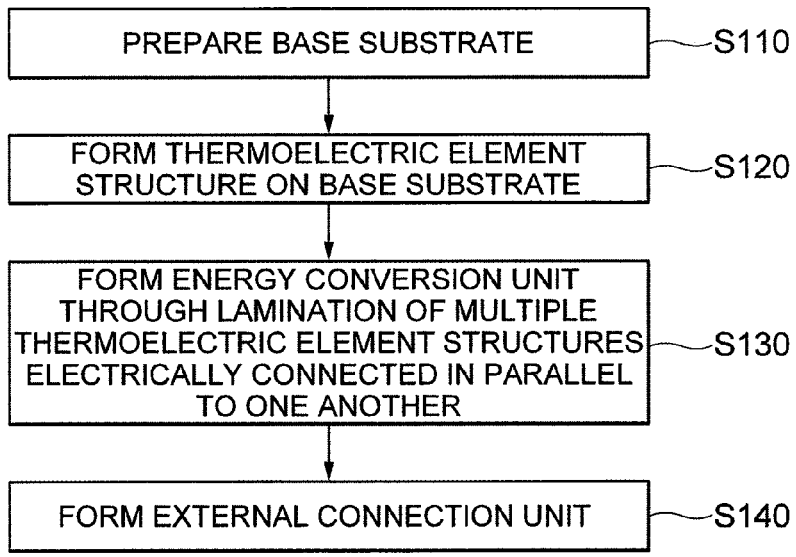
FIG. 5 is a flowchart illustrating a method for manufacturing the energy converting device in accordance with the embodiment of the present invention.
Figure 5:
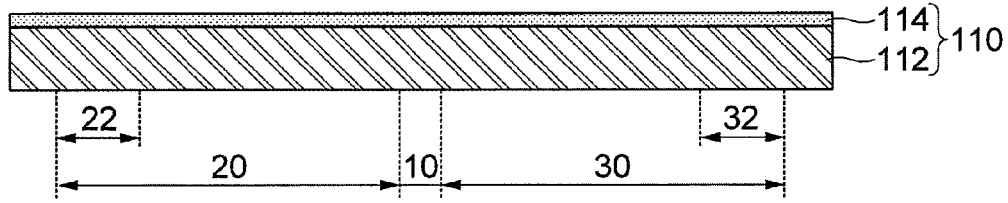

FIG. 5 is a flowchart illustrating a method for manufacturing an energy converting device in accordance with an embodiment of the present invention. FIGS. 6A to 6G are views illustrating a process of manufacturing the energy converting device in accordance with the embodiment of the present invention, respectively.

Referring to FIGS. 5 and 6A, the base substrate 110 may be prepared (step S110). The step of preparing the base substrate 110 may include the steps of: preparing the semiconductor substrate 112, and forming the buffer film 114 on the semiconductor substrate 112. The step of preparing the semiconductor substrate 112 may include a step of preparing a semiconductor substrate which includes semiconductor material, such as silicon. Also, a glass substrate may be used instead of the semiconductor substrate 112. The step of forming the buffer film 114 may be made through chemical vapor deposition, physical vapor deposition, and epitaxial growth process for the top part of the semiconductor substrate 112.

Meanwhile, the base substrate 110 may have the central region 10, and the one side region 20 and the opposite side region 30 which are positioned on both sides on the basis of the central region 10. Also, the one side region 20 may include the one side edge region 22 and the opposite side region 32. The one side edge region 22 is an outermost edge of one side in a region where the thermoelectric element structures are formed on the base substrate 110, and the opposite side region 32 is an outermost edge of the other side in a region where the thermoelectric element structures are formed on the base substrate 110.

Referring to FIGS. 5 and 6B to 6F, thermoelectric element structures 200, indicated by reference numeral 200 of FIG. 2, may be formed on the base substrate 110 (step S120). For example, the step of forming the thermoelectric element structures 200 may include a step of forming the first to fifth films 210 to 250 on the first base substrate 110.

Figure 6B:
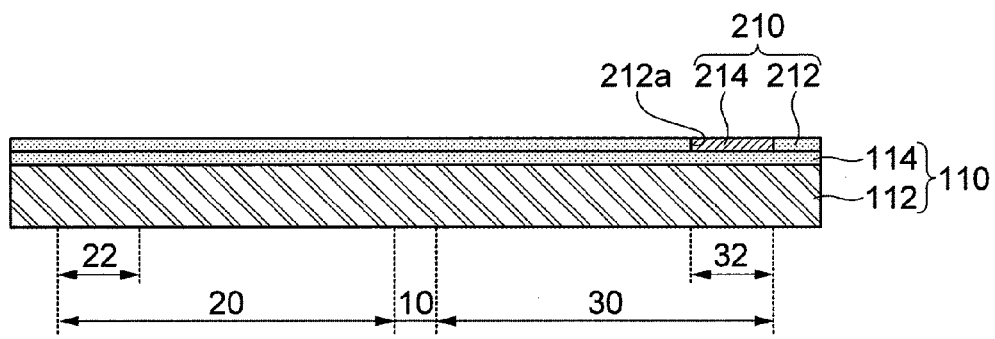
FIGS. 6A and 6G are views illustrating a process of manufacturing the energy converting device in accordance with the embodiment of the present invention.

Referring to FIG. 6B, the step of forming the first film 210 may include the steps of: forming the first insulating film 212 on the base substrate 110, forming a first trench 212a within the first insulating film 212 in such a manner to expose the opposite side edge region 32 of the buffer film 114 of the base substrate 110, and forming the first conductive film 214 in the first trench 212a.

Figure 6C:
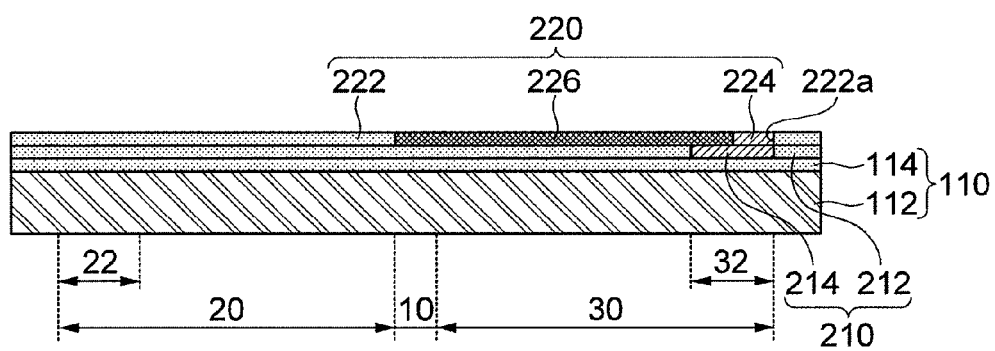

Referring to FIG. 6C, the step of forming the second film 220 may include the steps of: forming the second insulating film 222 that covers the first film 210, forming the second trench 222a; forming the second trench 222a which exposes the central region 10 and the opposite side region 30 of the first film 210, and forming a second conductive film 224 and an N-type thermoelectric pattern 226 in the second trench 222a. Herein, the second conductive film 224 may be formed to partially cover the first conductive film 214. Thus, the second conductive film 224 may be electrically connected to the first conductive film 214. Also, the N-type thermoelectric pattern 226 may be formed to cover an area occupied from the central region 10 of the first film 210 to a part of the first conductive film 214.

Figure 6D:
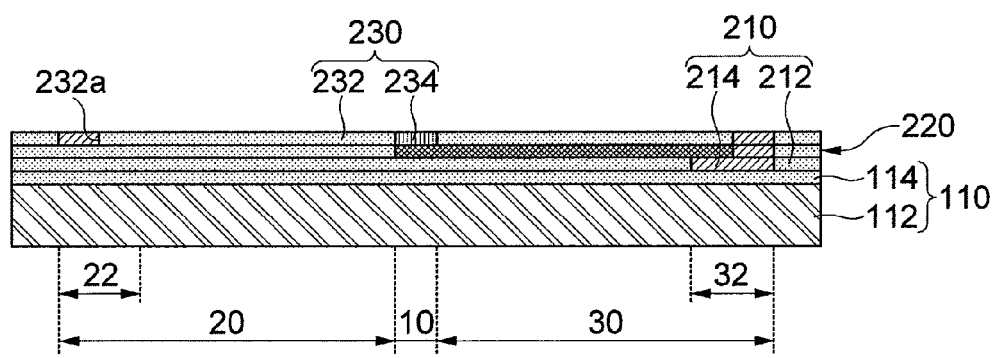

Referring to FIG. 6D, the step of forming the third films 230 may include the steps of: forming the third insulating film 232 that covers the second film 220; forming the third trenches 232a in the third insulating film 232 in such a manner that the trenches can respectively expose the one side edge region 22, the opposite side edge region 32, and the central region 10 of the second film 220, and forming the third conductive films 234 with which the third trenches 232a are filled. Herein, the third conductive film formed on the opposite side edge region 32 may be electrically connected to the second conductive film 224. Also, the third conductive film formed on the central region 10 may be disposed on an end of one side of the N-type thermoelectric pattern 226.

Figure 6E:
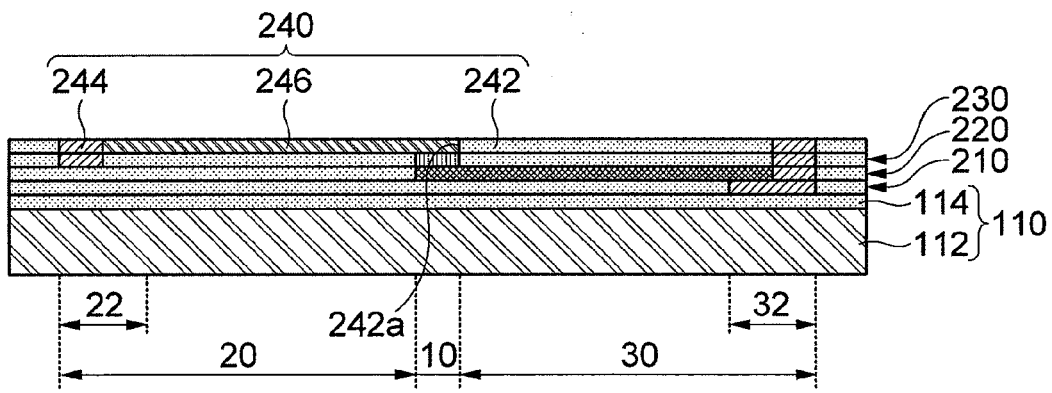

Referring to FIG. 6E, the step of forming the fourth film 240 may include the steps of: forming the fourth insulating film 242 that covers the third film 230; forming fourth trench 242a in the fourth insulating film 242 in such a manner that the trench can respectively expose the central region 10 and the one side region 20 of the third film 230; and forming the fourth conductive film 244 and the P-type thermoelectric pattern 246 in the fourth trench 242a. The fourth conductive films 244 may be disposed on each of the one side edge region 22 and the opposite side edge region 32. The P-type thermoelectric pattern 246 may be formed above the central region 10 and the one side region 20. Thus, the P-type thermoelectric pattern 246 may be connected to the N-type thermoelectric pattern 226 by the third conductive film 234 formed above the central region 10. Thus, the third conductive film 234 disposed above the central region 10 may be used as a conductor which can electrically interconnect the N-type thermoelectric pattern 226 to the P-type thermoelectric pattern 246.

Figure 6F:
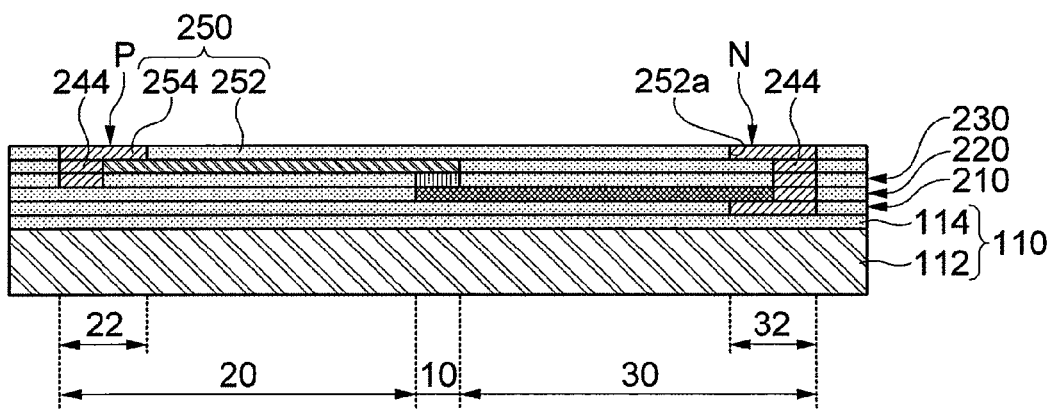

Referring to FIG. 6F, the step of forming the fifth film 250 may include the steps of: forming the fifth insulating film 252 that covers the fourth film 240, forming fifth trenches 252a in the fifth insulating film 252 in such a manner that the trenches can respectively expose the one side edge region 22 and the opposite side edge region 32 of the fourth film 240; and forming the fifth conductive films 254 in each of the fifth trenches 252a. The fifth conductive films 254 may be disposed on the fourth conductive films 244, respectively.

It is possible to manufacture one thermoelectric element structure on the base substrate 110 through the processes described with reference to FIGS. 6B to 6F. That is, the first to fifth conductive films 224 to 254 sequentially stacked on the one side edge region 22 are electrically interconnected to one another to thereby implement a P-type electrode (P). Also, the first to fifth conductive films 224 to 254 sequentially stacked on the opposite side edge region 32 are electrically interconnected to one another to thereby implement an N-type electrode (N). And, the N-type thermoelectric pattern 226 and the P-type thermoelectric pattern 246 may provide a path on which currents can flow between the P-type electrode (P) and the N-type electrode (N). Thus, when the temperature of the P-type electrode (P) is different from that of the N-type electrode (N), current flow may occur between the P-type electrode (P) and the N-type electrode (N). When temperature difference occurs between the P-type electrode (P) and the N-type electrode (N), one thermoelectric element structure where currents flow by seebeck effect may be manufactured on the base substrate 110.

Figure 6G:
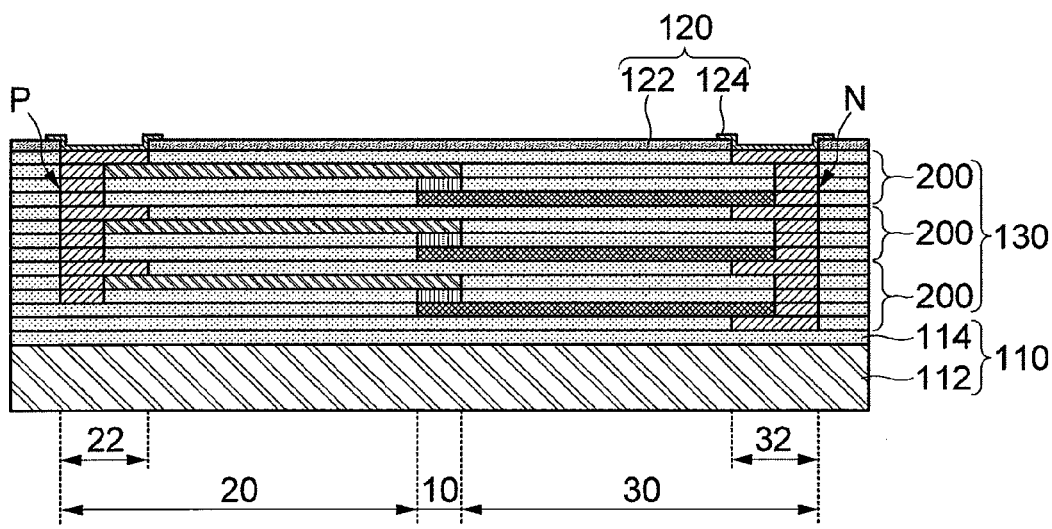

Referring to FIGS. 3 and 6G, a plurality of the thermoelectric element structures 200 may be stacked one on another and electrically interconnected in parallel to one another, thereby forming an energy conversion unit 130 (step S130). For example, the base substrate 110 having one thermoelectric element structure formed thereon is repeatedly subjected to the identical processes to those described with reference to FIGS. 6D to 6F, thereby forming a structure where the thermoelectric element structures 200 are sequentially stacked one on another. Herein, the thermoelectric element structures 200 may be formed to be electrically interconnected in parallel with one another, so that they can share the P-type electrode (P) and the N-type electrode (N). Thus, on the base substrate 110, it is possible to form an energy conversion unit 130 having the thermoelectric element structures which are constructed in a multiple layers and electrically interconnected in parallel with one another.

And, an external connection unit 120 may be formed on the energy conversion unit 130 (step S140). The step of forming the external connection unit 120 may include the steps of: forming a protective film 122 whose grooves 122a expose the N-type and P-type electrodes (N) and (P), on the energy conversion unit 130, and forming electrode pads 124 in the grooves 122a. Each of the electrode pads 124 may be used as an external connection unit through which the energy converting device 100 can electrically be connected to an external electronic apparatus (not shown).

Hereinafter, a description will be given of various examples for the energy converting device in accordance with an embodiment of the present invention, and the repeated description thereof will be omitted and simplified.

Figure 7:
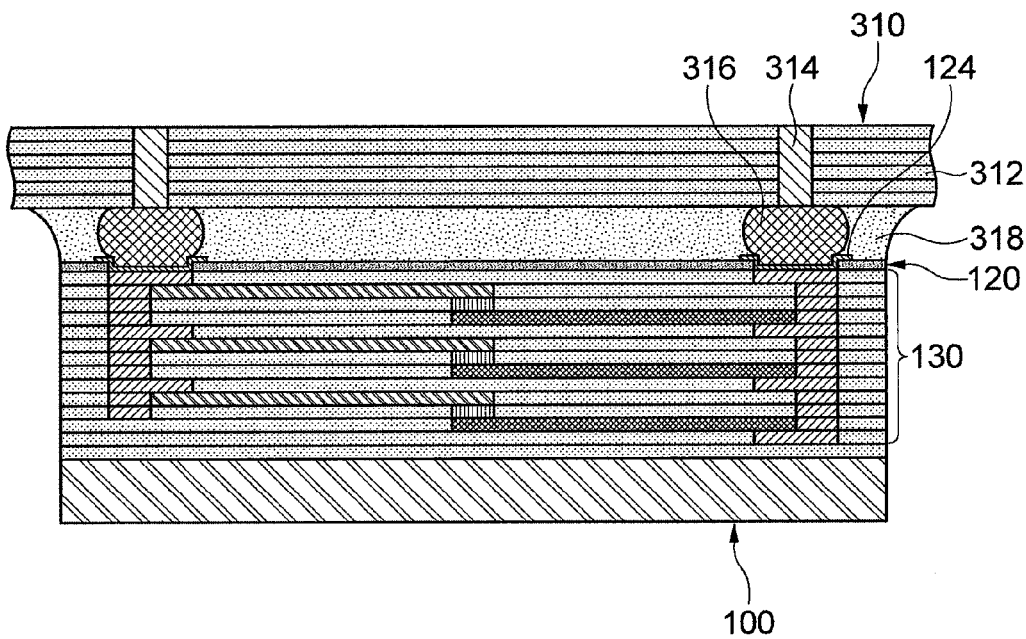
FIG. 7 is a view illustrating one example of an electronic apparatus equipped with the energy converting device in accordance with the embodiment of the present invention.

FIG. 7 is a view illustrating one example of an electronic apparatus equipped with the energy converting device in accordance with the embodiment of the present invention. Referring to FIG. 7, the electronic apparatus 300 in accordance with an embodiment of the present invention may be constructed to have an energy converting device 100 and a heating plate 310 coupled to the energy converting device 100. The heating plate 310 itself may produce heat. For example, the heating plate 310 may include various types of circuit substrates. One example of the heating plate 310 may be a mother board on which an electronic circuit is printed. The mother board may be provided with a printed circuit board 312 and conductive vias 314 formed in the printed circuit substrate 312. The conductive vias 314 may be electrically connected to the electrode pads 124 of the external connection unit 120 of the energy converting device 100 by a predetermined connection means 316. As for the predetermined connection means 316, a solder ball may be used. Meanwhile, a space between the energy converting device 100 and the heating plate 310 may be filled with underfill 318. The underfill 318 may absorb shock which is produced from the difference of coefficients of thermal expansion between the energy converting device 100 and the heating plate 310, and protect the predetermined connection means 316 from an external environment.

The electronic apparatus 300 with the above-described structure can increase energy converting efficiency of the energy converting device 100, by heat-generation temperature of the heating plate 310. In particular, in case where the heating plate 310 includes the mother board, the heating plate 310 continues to generate heat when the electronic apparatus 300 is powered on. Thus, the heating plate 310 can transfer the generated heat to the energy converting device 100 and by the heat-generation temperature, the energy converting device 100 can generate current flow by seebeck effect. In particular, since the electronic apparatus 300 with the above-described structure can provide a temperature difference higher than the energy converting device 100, it is possible to increase power of electric energy outputted by the energy converting device 100.

Meanwhile, the electronic apparatus 300 with the above-described structure may be applied to various types of mobile apparatuses. For example, the electronic apparatus 300 may be used in a notebook, a navigation, a watchphone, a cellular phone, and an MP3, in addition to various types of mobile apparatuses. The electronic apparatus 300 may be also applied to a portable phone cradle, a protective case, and so on. Herein, if it is assumed that the electronic apparatus 300 corresponds to a portable terminal, such as a watch phone, and a cellular phone, the electronic apparatus 300 may have a structure where the heating plate 310 is positioned on the upper portion of the energy converting device 100 and a human's body such as a wrist is positioned on the lower portion of the energy converting device 100. Thus, the electronic apparatus 300 can continuously convert energy by using a temperature difference between the human's body and the heating plate 310 which applies heat to the energy converting device 100, thereby enhancing energy converting efficiency of the thermoelectric element structures 200.

Figure 8:
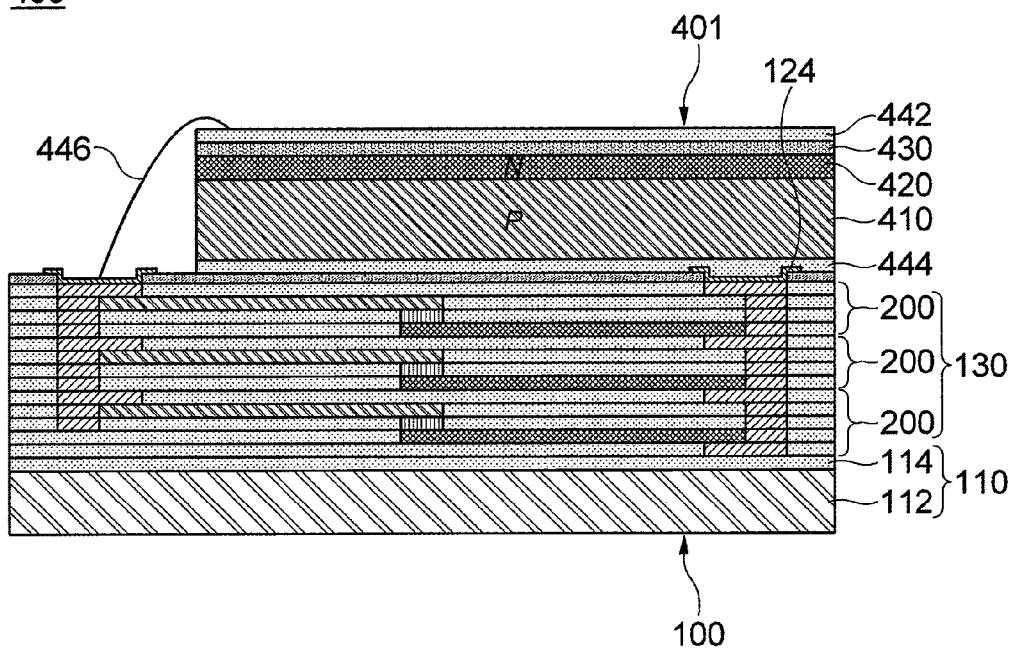
FIGS. 8 and 9 are views illustrating other examples of an electronic apparatus equipped with the energy converting device in accordance with the embodiment of the present invention, respectively.
Figure 9:
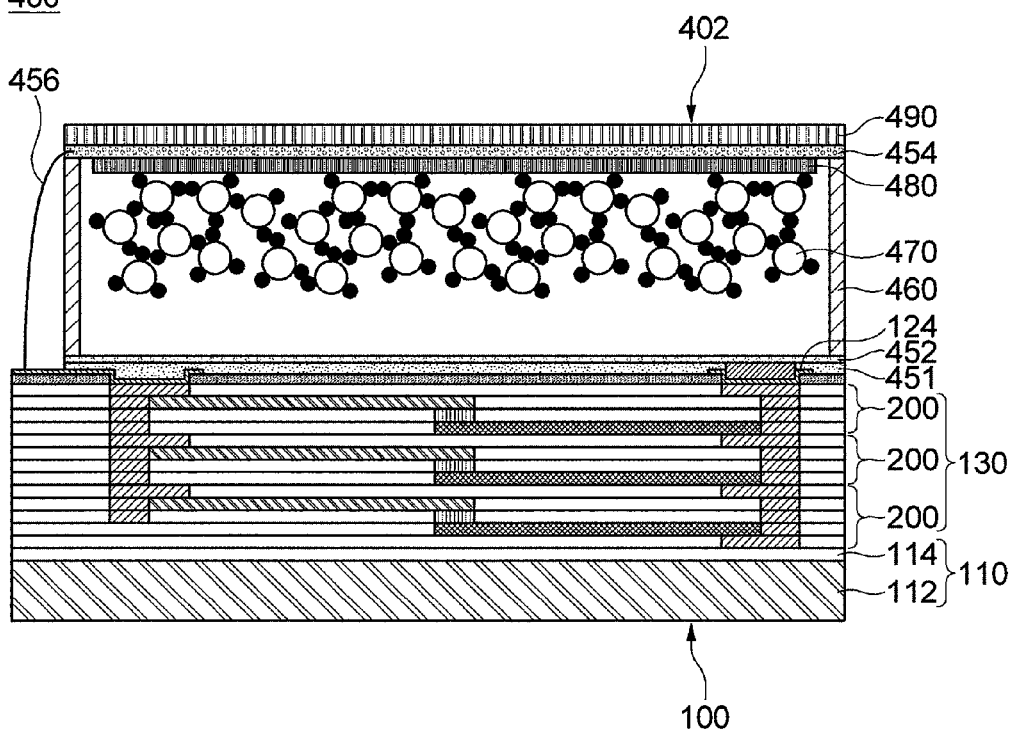

FIGS. 8 and 9 are views illustrating other examples of the electronic apparatus provided with the energy converting device in accordance with an embodiment of the present invention. Referring to FIG. 8, an electronic apparatus 400 in accordance with other embodiment of the present invention may be provided with the energy converting device 100 and a solar cell coupled to the energy converting device 100. The solar cell may include at least one of a silicon-based solar cell, an organic-based solar cell, a CGIS-based solar cell, and a dye-sensitized solar cell.

For example, referring to FIG. 8, the solar cell may be a silicon-based solar cell 401. The silicon-based solar cell 401 may have a structure in which a lower electrode layer 444, a P-type semiconductor layer 410, an N-type semiconductor layer 420, an anti-reflective film 430, and an upper electrode layer 442 are sequentially stacked on the energy converting device 100. The lower electrode layer 444 may be electrically interconnected to any one of electrode pads 124 of the external connection unit 120. The upper electrode layer 442 may be electrically interconnected to the other electrode pads 124 of the external connection unit 120 by a boding wire 446. Thus, it is possible to implement a hybrid-type energy converting structure in which the energy converting device 100 is electrically connected to the silicon-based solar cell 401.

As for other example of the solar cell, referring to FIG. 9, the dry-sensitized solar cell may be exemplified. The dry-sensitized solar cell 402 may include a lower transparent electrode 452, an upper transparent electrode 454, a side wall 460, a transition metal oxide 470, a catalyst layer 480, and a transparent substrate 490. The lower transparent electrode 452 may be bonded to the energy converting device 100 through an insulating layer 451 interposed therebetween. The lower transparent electrode 452 may be electrically connected to any one of electrode pads 124 of the external connection unit 120. The upper transparent electrode 454 may be electrically connected to the other electrode pad of the external connection unit 120 by the bonding wire 456. The transition metal oxide 470 may be provided in an inner space partitioned from an external environment by being surrounded by the lower transparent electrode 452, the upper transparent electrode 454, and the side wall 460. The inner space may be filled with a predetermined electrolyte. The transition metal oxide 470 may include at least one of TiO2, SnO3, and ZnO. The catalyst layer 480 may include a material of Pt. Thus, it is possible to implement a hybrid-type energy converting structure where the energy converting device 100 is electrically connected to the dry-sensitized solar cell 402.

The electronic apparatus 400 may have a structure where the energy converting device 100 is coupled to the solar cells 401 and 402. Herein, the energy converting device 100 may be an energy converting device that can convert thermal energy into electric energy, and the solar cells 401 and 402 may be an energy converting device that can convert solar energy into electric energy. Therefore, the electronic apparatus 400 can provide an energy converting structure of a hybrid type. The energy converting structure as described above may be applied to various types of electronic apparatus, and thus it may be used as an energy converting device. For example, the energy converting structure may be applied to a notebook, a navigation, a watchphone, a cellular phone, and an MP3, in addition to various types of mobile apparatuses. Also, the electronic apparatus 400 may be applicable to a portable phone cradle, and a protective case.

The energy converting device of the present invention may include a base substrate and a plurality of thermoelectric element structures which are disposed on the base substrate, stacked in the same configuration, and interconnected in parallel to one another. Thus, the energy converting device can improve energy converting efficiency when thermal energy is converted into electric energy, by being constructed through an increase in the number of the thermoelectric element structures.

In a method for manufacturing the energy converting device in accordance with an embodiment of the present invention, it is possible to manufacture an energy converting device including a plurality of thermoelectric element structures which are disposed on the base substrate, stacked in the same configuration, and interconnected in parallel to one another. Thus, the method of manufacturing the energy converting device of the present invention is achieved by increasing the number of the thermoelectric element structures. Therefore, it is possible to manufacture an energy converting device which can provide high energy converting efficiency.

An electronic apparatus of the present invention may include a base substrate, an energy converting device, and a heating plate. The energy converting device includes a plurality of thermoelectric element structures which are disposed on the base substrate, stacked in the same configuration, and interconnected in parallel to one another, and the heating plate is coupled to the energy converting device. The heating plate may be a circuit substrate which applies heat to the energy converting device so that current flow in the thermoelectric element structures occurs by seebeck effect. The electronic apparatus may have a structure for improving energy converting efficiency of the energy converting device.

An electronic apparatus of the present invention may include a base substrate, an energy converting device, and a solar cell. The energy converting device includes a plurality of thermoelectric element structures which are disposed on the base substrate, stacked in the same configuration, and interconnected in parallel to one another, and the solar cell is coupled to the energy converting device. Thus, the electronic apparatus of the present invention may have a structure of a hybrid energy converting apparatus which can convert thermal and solar energy into electric energy.

As described above, although the preferable embodiments of the present invention have been shown and described, it will be appreciated by those skilled in the art that substitutions, modifications and variations may be made in these embodiments without departing from the principles and spirit of the general inventive concept, the scope of which is defined in the appended claims and their equivalents.

What is claimed is:
1. An energy converting device comprising:
a base substrate; and
a plurality of thermoelectric element structures which are sequentially stacked on the base substrate and electrically interconnected in parallel to one another, wherein:
each of the thermoelectric element structures comprises:
a P-type electrode disposed above an edge of one side of the base substrate in a perpendicular direction to the base substrate, the P-type electrode having a multilayer structure where a plurality of conductive films are stacked;
an N-type electrode disposed above an edge of another side of the base substrate in a perpendicular direction to the base substrate, the N-type electrode having a multilayer structure where a plurality of conductive films are stacked;
a P-type thermoelectric pattern which extends toward the N-type electrode from the P-type electrode in parallel with the base substrate;
an N-type thermoelectric pattern which extends toward the P-type electrode from the N-type electrode in parallel with the base substrate; and
a conductor which is vertically interposed between the P-type thermoelectric pattern and the N-type thermoelectric pattern, and the N-type and P-type thermoelectric patterns alternately disposed at mutually different heights in such a manner that an end of the N-type thermoelectric pattern is electrically connected by the conductor to an end of the P-type thermoelectric pattern which partially faces said end of the N-type thermoelectric pattern.

2. The energy converting device of claim 1,
wherein the N-type electrode and P-type electrode of each of the thermoelectric element structures are spaced apart from each other,
wherein the energy converting device further comprises:
an external connection unit for electrically connecting the device to an external electronic apparatus,
wherein the external connection unit comprises:
a protective film which has grooves to expose the N-type electrode and P-type electrode of each of the thermoelectric element structures and covers the uppermost thermoelectric element structure among the thermoelectric element structures; and
electrode pads which are respectively connected to the N-type electrode and P-type electrode of each of the thermoelectric element structures and cover the grooves.

3. An electronic apparatus comprising:
an energy converting device including thermoelectric element structures which convert thermal energy into electric energy by seebeck effect; and
at least one heating plate which is coupled to the energy converting device to thereby apply heat to the energy converting device, wherein:
the energy converting device comprises:
    a base substrate; and
    a plurality of thermoelectric element structures which are sequentially stacked on the base substrate and electrically interconnected in parallel to one another, and
each of the thermoelectric element structures comprising:
    a P-type electrode disposed above an edge of one side of the base substrate in a perpendicular direction to the base substrate, the P-type electrode having a multilayer structure where a plurality of conductive films are stacked;
    an N-type electrode disposed above an edge of another side of the base substrate in a perpendicular direction to the base substrate, the N-type electrode having a multilayer structure where a plurality of conductive films are stacked;
    a P-type thermoelectric pattern which extends toward the N-type electrode from the P-type electrode in parallel with the base substrate;
    an N-type thermoelectric pattern which extends toward the P-type electrode from the N-type electrode in parallel with the base substrate; and
    a conductor which is vertically interposed between the P-type thermoelectric pattern and the N-type thermoelectric pattern, and
the N-type and P-type thermoelectric patterns alternately disposed at mutually different heights in such a manner that an end of the N-type thermoelectric pattern is electrically connected by the conductor to an end of the P-type thermoelectric pattern which partially faces said end of the N-type thermoelectric pattern.

4. The electronic apparatus of claim 3, wherein the heating plate includes a circuit board.

5. The electronic apparatus of claim 3, wherein the heating plate comprises a mother board,
wherein the mother board comprises:
a printed circuit board on which a circuit pattern is printed; and
conductive vias which are formed in the printed circuit board and electrically connected to the N-type electrode and P-type electrode of each thermoelectric element structure.

6. An electronic apparatus comprising:
an energy converting device having thermoelectric element structures which convert thermal energy into electric energy by seebeck effect; and
a solar cell coupled to the energy converting device, wherein:
the energy converting device comprises:
    a base substrate; and
    a plurality of thermoelectric element structures which are sequentially stacked on the base substrate and electrically interconnected in parallel to one another, and
each of the thermoelectric element structures comprises:
    a P-type electrode disposed above an edge of one side of the base substrate in a perpendicular direction to the base substrate, the P-type electrode having a multilayer structure where a plurality of conductive films are stacked;
    an N-type electrode disposed above an edge of another side of the base substrate in a perpendicular direction to the base substrate, the N-type electrode having a multilayer structure where a plurality of conductive films are stacked;
    a P-type thermoelectric pattern which extends toward the N-type electrode from the P-type electrode in parallel with the base substrate;
    an N-type thermoelectric pattern which extends toward the P-type electrode from the N-type electrode in parallel with the base substrate; and
    a conductor which is vertically interposed between the P-type thermoelectric pattern and the N-type thermoelectric pattern, and
the N-type and P-type thermoelectric patterns alternately disposed at mutually different heights in such a manner that an end of the N-type thermoelectric pattern is electrically connected by the conductor to an end of the P-type thermoelectric pattern which partially faces said end of the N-type thermoelectric pattern.

7. The electronic apparatus of claim 6, wherein the solar cell comprises:
a semiconductor layer including a P-type semiconductor layer and an N-type semiconductor layer which are stacked one above the other;
an upper electrode layer disposed above the semiconductor layer;
an anti-reflective film disposed on the upper electrode layer; and
a lower electrode layer interposed between the semiconductor layer and the energy converting device.

8. The electronic apparatus of claim 6, wherein the solar cell comprises:
an upper transparent electrode and a lower transparent electrode spaced apart from each other; a transition metal oxide disposed in an inner space surrounded by side walls, the upper transparent electrode, and the lower transparent electrode; and a transparent substrate disposed on the upper transparent electrode.

* * * * *